(12) United States Patent
Chou et al.

(10) Patent No.: US 10,991,426 B2
(45) Date of Patent: Apr. 27, 2021

(54) MEMORY DEVICE CURRENT LIMITER

(71) Applicant: Taiwan Semiconductor Manufacturing Company, Ltd., Hsinchu (TW)

(72) Inventors: Chung-Cheng Chou, Hsin-Chu (TW); Tien-Yen Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/694,114

(22) Filed: Nov. 25, 2019

(65) Prior Publication Data

US 2020/0243135 A1 Jul. 30, 2020

Related U.S. Application Data

(60) Provisional application No. 62/796,864, filed on Jan. 25, 2019.

(51) Int. Cl.
*G11C 13/00* (2006.01)

(52) U.S. Cl.
CPC ........ *G11C 13/0038* (2013.01); *G11C 13/003* (2013.01); *G11C 13/0026* (2013.01)

(58) Field of Classification Search
CPC ............ G11C 13/0069; G11C 16/0483; G11C 11/1675; G11C 16/26; G11C 16/10; G11C 16/3459; G11C 16/12; G11C 16/0408; G11C 7/00
USPC .................... 365/148, 158, 185.24
See application file for complete search history.

(56) References Cited

U.S. PATENT DOCUMENTS

| | | | |
|---|---|---|---|
| 5,896,334 A * | 4/1999 | Casper .................. | G11C 17/18 365/200 |
| 6,642,791 B1 | 11/2003 | Balan | |
| 7,646,574 B2 * | 1/2010 | Imura ..................... | G05F 1/575 361/93.1 |
| 9,257,178 B1 * | 2/2016 | Chou ................. | G11C 13/0002 |
| 10,032,511 B1 * | 7/2018 | Hung ................. | G11C 13/0026 |
| 10,340,002 B1 * | 7/2019 | Kim ........................ | G06N 3/084 |
| 10,586,600 B1 * | 3/2020 | Yamada .................. | G11C 5/08 |
| 2003/0022411 A1 * | 1/2003 | Sumitani ............ | G11C 16/3445 438/48 |
| 2006/0245283 A1 * | 11/2006 | Vogelsang ............. | G11C 7/065 365/205 |
| 2007/0014157 A1 * | 1/2007 | Hung ..................... | G11C 16/24 365/185.18 |
| 2007/0200545 A1 | 8/2007 | Loi et al. | |
| 2008/0080235 A1 * | 4/2008 | Tran ................... | G11C 16/0408 365/185.03 |
| 2008/0084743 A1 * | 4/2008 | Grant ..................... | G11C 14/00 365/185.08 |
| 2008/0094871 A1 * | 4/2008 | Parkinson ............. | G11C 7/1075 365/100 |
| 2008/0192545 A1 * | 8/2008 | Chen ..................... | G11C 16/12 365/185.11 |

(Continued)

*Primary Examiner* — Michael T Tran
(74) *Attorney, Agent, or Firm* — Merchant & Gould P.C.

(57) ABSTRACT

A memory device includes a memory array including a plurality of memory cells arranged in rows and columns. A closed loop bias generator is configured to output a column select signal to the memory array. A current limiter receives an output of the closed loop bias generator. The current limiter is coupled to a plurality of the columns of the memory array.

20 Claims, 5 Drawing Sheets

(56) References Cited

U.S. PATENT DOCUMENTS

| | | | | |
|---|---|---|---|---|
| 2008/0266967 A1* | 10/2008 | Iwai | G11C 16/12 | 365/185.18 |
| 2009/0207645 A1* | 8/2009 | Parkinson | G11C 13/003 | 365/145 |
| 2010/0074028 A1* | 3/2010 | Hirose | G11C 16/14 | 365/185.29 |
| 2010/0085799 A1* | 4/2010 | Cho | G11C 13/004 | 365/148 |
| 2012/0182783 A1* | 7/2012 | Bedeschi | G11C 13/0069 | 365/148 |
| 2012/0201081 A1* | 8/2012 | Imai | G11C 16/12 | 365/185.18 |
| 2013/0235651 A1* | 9/2013 | Perner | G11C 13/0002 | 365/148 |
| 2016/0019962 A1 | 1/2016 | Haukness | | |
| 2016/0062830 A1* | 3/2016 | Cha | G11C 29/702 | 714/764 |
| 2016/0125937 A1* | 5/2016 | Kang | G11C 13/0038 | 365/148 |
| 2017/0004882 A1 | 1/2017 | Bateman | | |
| 2017/0047104 A1* | 2/2017 | Abedifard | G11C 11/1675 | |
| 2017/0099049 A1* | 4/2017 | Sandhu | H03K 17/687 | |
| 2017/0177515 A1* | 6/2017 | Yoon | G11C 11/2297 | |
| 2017/0330602 A1* | 11/2017 | Zhou | G11C 5/147 | |
| 2017/0352418 A1* | 12/2017 | Bertin | G11C 29/021 | |
| 2018/0083578 A1 | 3/2018 | Klaren et al. | | |
| 2018/0143659 A1* | 5/2018 | Wulff | G05F 3/242 | |
| 2018/0323780 A1* | 11/2018 | Chen | G11C 5/145 | |
| 2019/0043573 A1* | 2/2019 | Buchanan | G11C 13/0069 | |
| 2019/0051351 A1* | 2/2019 | Pyo | G11C 11/1657 | |
| 2019/0078940 A1* | 3/2019 | Choi | G11C 7/04 | |
| 2019/0214078 A1* | 7/2019 | Kim | G11C 13/0038 | |
| 2019/0371399 A1* | 12/2019 | Haukness | G11C 13/0028 | |
| 2019/0377377 A1* | 12/2019 | Sarkar | G05F 3/245 | |
| 2020/0082881 A1* | 3/2020 | Terada | G11C 13/0028 | |
| 2020/0294580 A1* | 9/2020 | Raj | G11C 7/227 | |

* cited by examiner

MEMORY DEVICE CURRENT LIMITER

CROSS-REFERENCE TO RELATED APPLICATION

This application claims priority to U.S. Provisional Patent Application No. 62/796,864, filed Jan. 25, 2019, the disclosure of which is hereby incorporated by reference in its entirety.

BACKGROUND

Memory devices are used to store information in semiconductor devices and systems. Resistive Random Access Memory (RRAM) cells are non-volatile memory cells that store information based on changes in electric resistance. In general, an RRAM cell includes a storage node in which a bottom electrode, a resistive switching layer and a top electrode may be sequentially stacked. The resistance of the resistive switching layer varies according to an applied voltage. An RRAM cell can be in a plurality of states in which the electric resistances are different. Each different state may represent a digital information. The state can be changed by applying a predetermined voltage or current between the electrodes. A state is maintained as long as a predetermined operation is not performed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
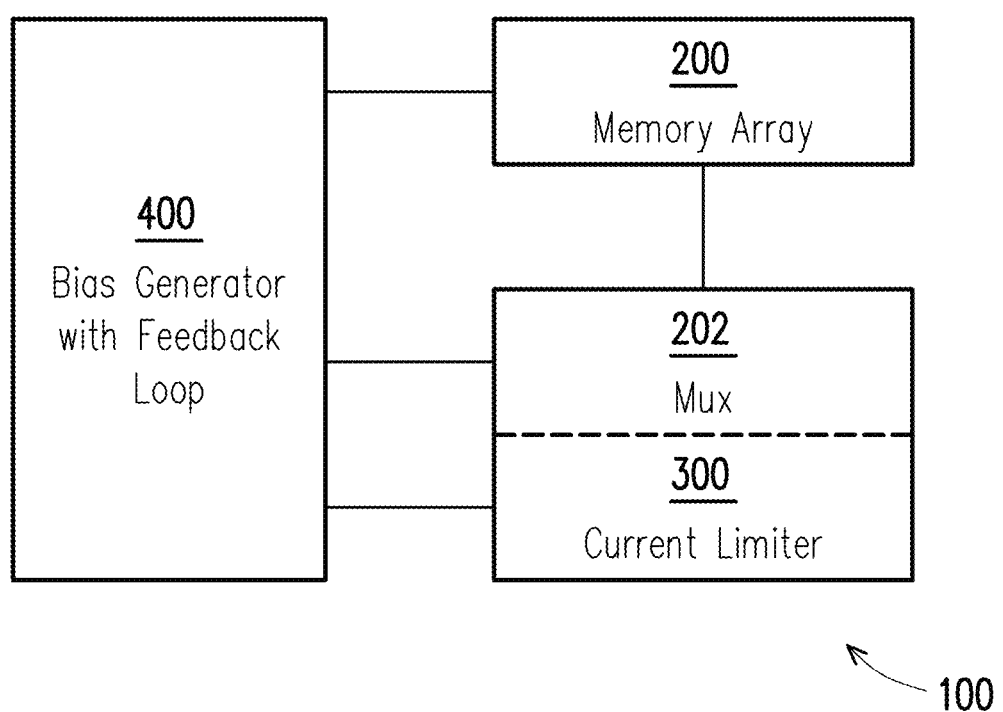
FIG. 1 is a block diagram generally illustrating an example memory device including a bias generator operatively coupled to an array of resistive memory cells and a current limiter in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An RRAM memory device generally may include an array of RRAM cells, each of which includes an RRAM resistive element and an access transistor. The RRAM resistive element has a resistive state that is switchable between a low resistive state and a high resistive state. RRAM devices generally comprise a layer of high-k dielectric material arranged between conductive electrodes disposed within a back-end-of-the-line (BEOL) metallization stack. The reversible switching between low and high resistive states in an RRAM device is enabled by selectively forming a conductive filament through the layer of high-k dielectric material. By applying voltage to the RRAM cell, a switching event forming a conductive filament through the layer of high-k dielectric material and thereby switching the RRAM device from the high resistance state to the low resistance state occurs and is called the "SET" operation. Conversely, the switching event from the low resistance state to the high resistance state is called the "RESET" operation. The low and high resistance are utilized to indicate a digital signal, "1" or "0", thereby allowing for data storage.

In each RRAM cell, the RRAM resistive element has a first terminal coupled to a bit line and a second terminal coupled to an access transistor. The access transistor has a gate coupled to a word line, a source coupled to a source line and a drain coupled to a second terminal of the RRAM resistive element. By activating the word line, the access transistor is turned on, allowing for the source line to be coupled to the second terminal of the RRAM resistive element.

During RRAM operations such as RRAM forming and set operations, a fixed current level is desirable. A current limiter circuit may be employed for such RRAM forming and SET operations. A current limiter can fix RRAM cell filament size by a fixed compliance current level. To ensure good current limiting performance, a cascode transistor structure is often adopted to increase the resistance (Rout) of the current limiter, as compared with a single transistor current limiter. However, such structures can increase the voltage overhead during operation and therefore burden write power, especially at charge pump mode. Such structures can also increase the IC chip area overhead needed for the current limiter circuitry for each column of the RRAM memory array.

Some conventional current limiters use a cascode, or stacked transistor structure, with a fixed gate bias voltage applied to the top device of the current limiter. To increase the Rout of the current limiter, the bottom transistor usually operates in the saturation region. The total operation voltage overhead will be the saturation voltage of bottom transistor plus the drain-source voltage (VDS) of the top device. Further, the total operation voltage of a cascode current limiter, and the associated voltage overhead, can vary. Such variation can occur when using a fixed gate bias for the top transistor because temperature fluctuations, or differences in transistor performance due to manufacturing variability within the process corners of the IC design, in the top transistor can also affect the VDS of bottom transistor.

FIG. 1 is a block diagram generally illustrating aspects of an example memory device 100 including a closed loop bias generator 400 operatively coupled to an array of resistive memory cells 200 and a current limiter 300 in accordance with some embodiments. Each RRAM cell of the array 200 has a first terminal coupled to a bit line and a second terminal coupled to an access transistor. The access transistor has a gate coupled to a word line, a source coupled to a source line and a drain coupled to a second terminal of the RRAM resistive element.

Memory cells of the array 200 are identified for reading and writing operations via a memory address received from, for example, a processor of a computer. The memory address is decoded into row and column addresses identifying a particular row and column, respectively, of the array 200. Based on the row address, the selected word line is activated and the corresponding access transistor is turned on, allowing the source line to be coupled to the second terminal of the RRAM resistive element. The column address is received by a column multiplexer (MUX) 202, which is configured to select a particular column of the array 200 in response to the column address.

In the embodiment shown, the current limiter 300 is operatively coupled to the array 200 to limit the current applied to the RRAM resistive elements during SET operations, for example. As will be discussed further below, examples of the MUX 202 include components that also form the current limiter 300. In other words, some elements of the MUX 202 may be "shared" between both the MUX 202 and the current limiter 300.

The bias generator 400 is operatively coupled to the current limiter 300 to provide the bias voltage applied to the current limiter 300. Moreover, as will also be discussed further below, examples of the bias generator include a feedback loop to maintain a desired bias voltage to the current limiter 300.

Figure 2:
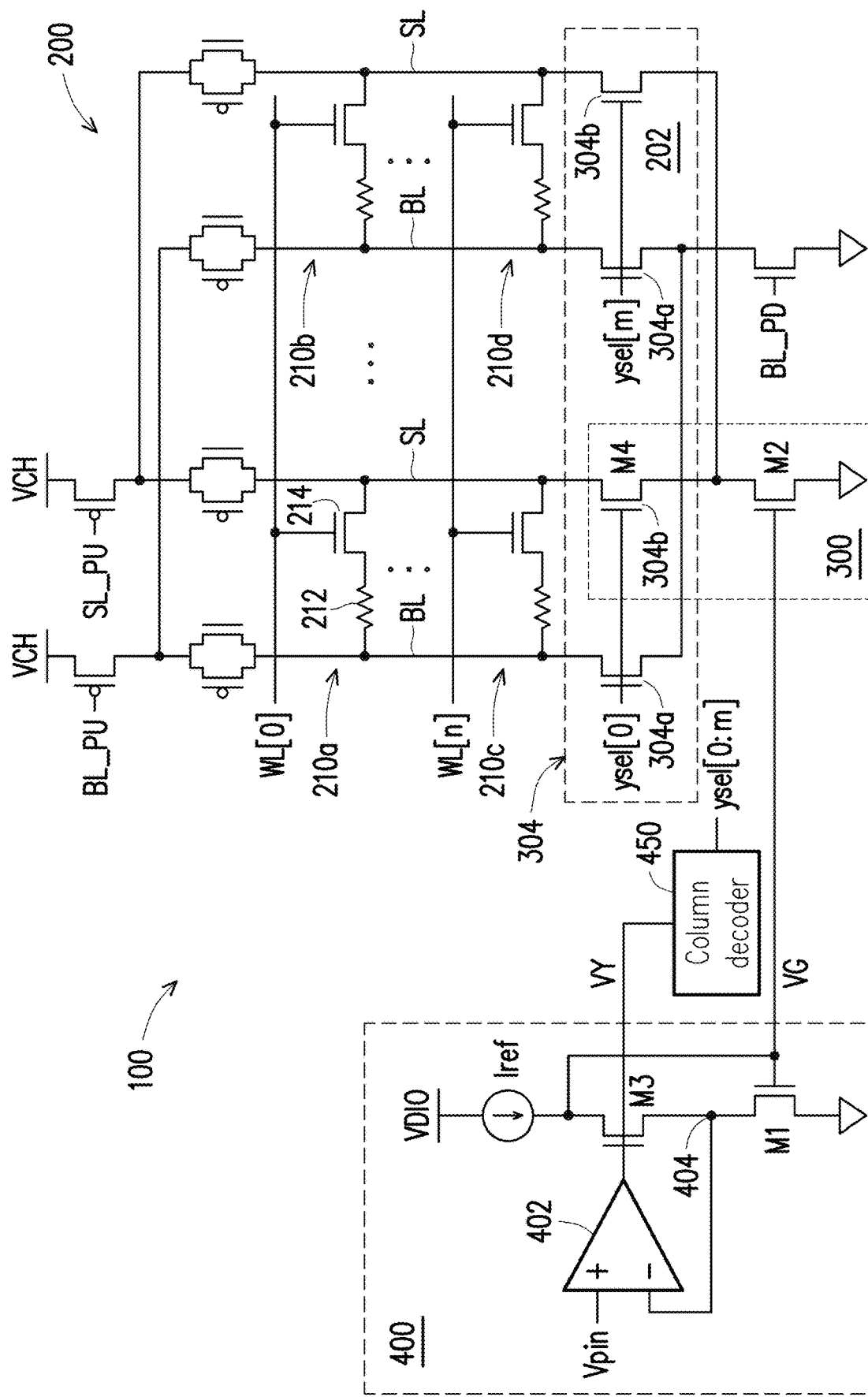
FIG. 2 is a circuit diagram illustrating an example bias generator circuit coupled to an example current limiter circuit and an array of resistive memory cells in accordance with some embodiments.

FIG. 2 is a circuit diagram illustrating an example of the memory device 100 including a bias generator circuit 400 coupled to an example current limiter circuit 300 and an array of resistive memory cells 200 in accordance with some embodiments.

The illustrated array of resistive memory cells 200 includes a plurality of resistive memory (e.g. RRAM) cells. For simplicity, only four RRAM memory cells 210a-d are shown in FIG. 2 (referred to collectively as cells 210); a typical resistive memory array would include many more RRAM memory cells. The RRAM cells 210 are arranged within the array of resistive memory cells 200 in rows and/or columns. The RRAM cells 210 within a row of the array of resistive memory cells 200 are operably coupled to a word line, e.g. the RRAM cell 210a is operably coupled to WL[0]. The RRAM cells 210 within a column of the array of resistive memory cells 200 are operably coupled to a bit line BL and a source line SL. Individual RRAM cells 210 are respectively associated with an address defined by the word line, e.g. WL[n], and the bit line/source line pairs of each column, e.g. ysel[m]. In the embodiment shown, the array of resistive memory cells 200 contains n+1 rows (WL[0] to WL[n]) and m+1 columns (ysel[0] to ysel[m]), where n and m are integers greater than 0.

Each of the RRAM cells 210 includes a resistive memory element 212 and an access transistor 214. The resistive memory element 212 has a resistive state that is switchable between a low resistive state and a high resistive state. The resistive states are indicative of a data value (e.g., a "1" or "0") stored within the resistive memory element 212. The resistive memory element 212 has a first terminal coupled to the bit line BL and a second terminal coupled to the access transistor 214. The access transistor 214 has a gate coupled to the word line of the row in which the RRAM cell 210 resides, e.g. WL[0], a source coupled to the source line SL, and a drain coupled to the second terminal of the resistive memory element 212.

The array of resistive memory cells 200 is configured to read data from and/or write data to the plurality of RRAM cells 210. A word line signal, such as a word line voltage $V_{WL}$ is applied to one of the word lines WL based on a received word line address, and bit line/source line signals are applied to appropriate bit lines BL and source lines SL. By selectively applying signals to the word lines WL, bit lines BL, and source lines SL, forming, SET, RESET, READ operations may be performed on selected ones of the plurality of RRAM cells 210. For example, to SET data for RRAM cell 210a, a word line voltage $V_{WL}$ is applied to the word line WL[0], and BL/SL voltages (VBL/VSL) are applied to the bit line BL and a source line SL for column m. The applied VBL/VSL cause a predetermined SET current to flow through the resistive memory element 212 forming a filament and changing the resistive memory element 212 to the low resistance state, thereby storing a logic "1" datum in the RRAM cell 210a.

In some embodiments, the array of resistive memory cells 200 is connected to the column MUX 202. The column MUX 202 includes a plurality of column select transistors 304 operatively connected to the bit lines BL and source lines SL of the array of resistive memory cells 200. In the simplified example shown in FIG. 2, the MUX 202 includes bit line select transistors 304a and source line select transistors 304b for each column of the memory array 200.

A column decoder, for example column decoder 450, determines the column for which an operation, e.g. forming, SET, RESET, READ, is to occur, and sends a signal, e.g. a column select ysel[m], to the gates of the column select transistors 304 of the appropriate column. In some embodiments, the column decoder 450 is a purely logic device that outputs a zero voltage signal, e.g. no signal, for unselected columns cutting off the current limiter circuit from the source lines SL and bit lines BL of the unselected columns, and the column decoder 450 outputs the voltage signal VY of the Op Amp 402 output for the selected column, e.g. ysel[m]=VY for the selected column.

In some embodiments, the current limiter circuit 300 includes a transistor cascode including a top transistor M4 and a bottom transistor M2. In the example shown, the top transistor M4 is the source line select transistor 304b, which is connected to the source line SL of a column of the array of resistive memory cells 200. Each of the transistors 304b of the illustrated array forming the top devices of the current limiter 300 are connected to the bottom current limiter transistor M2. The top transistors 304b further include a gate connected to the output of a column decoder, for example, column decoder 450. The bottom transistor M2 is connected to ground and has a gate connected to the bias generator 400. In some embodiments, both the top transistor M4 and the bottom transistor M2 of the cascode can be NMOS MOSFET transistors. In other embodiments, other transistor types can be used well.

Thus, in some examples, the column select transistors 304b connected to the source lines SL in the column MUX 202 of the array of resistive memory cells 200 can be used as the top transistor M4 in the current limiter circuit 300. In some embodiments, such as the example illustrated in FIG. 2, the bottom transistor M2 in the current limiter circuit 300 can be a global transistor connected to each of the column select transistors M4 of the column MUX 202 of the array of resistive memory cells 200. The area required for the current limiter circuit 300 can be reduced by using such a global bottom transistor M2 as the bottom transistor for the cascode of each of the columns of the array of resistive memory cells 200, as compared to including a plurality of bottom transistors M2 corresponding to each of the plurality of columns in the array of resistive memory cells 200. Area overhead in an IC using a memory device 100 due to including the current limiter circuit 300 for each of the columns of the array of resistive memory cells 200 is further reduced by utilizing the column select transistors 304 of the column MUX 202 of the array of resistive memory cells 200 as the top transistor M4 in the current limiter circuit 300 for each of the columns.

In some embodiments, the bias generator circuit 400 includes operational amplifier (Op Amp) 402, a transistor M3, a transistor M1, a node 404, and a voltage supply terminal connected to a voltage source VDIO for providing a predetermined reference current Iref. The transistor M3 has a source terminal connected to the voltage source VDIO and the gates of both the M1 transistor and the bottom transistor M2 of the current limiter circuit 300. The transistor M3 also has a drain terminal connected to the source terminal of the M1 transistor and the inverting input terminal of the Op Amp 402, and a gate connected to the output of the Op Amp 402. The transistor M1 has a drain terminal connected to ground. The Op Amp 402 has a non-inverting input terminal connected to receive a predetermined clamping voltage Vpin. The output terminal of the Op Amp 402 is additionally connected to the column decoder 450 for routing of its output voltage VY to the gates of the column select transistors 304 of the column MUX 202 of the array of resistive memory cells 200, including the top transistors M4 of each of the columns in the array of resistive memory cells 200, as the signal ysel[m]. For example, for a column m determined by the column decoder 450, the voltage applied to the gates of the column selected transistors connected to the bit line BL and source SL of the column m, e.g. ysel[m], is equal to the output voltage VY of the Op Amp 402. Operation of the bias generator circuit 400 in conjunction with the current limiter circuit 300 is discussed below in relation to FIG. 3.

Figure 3:
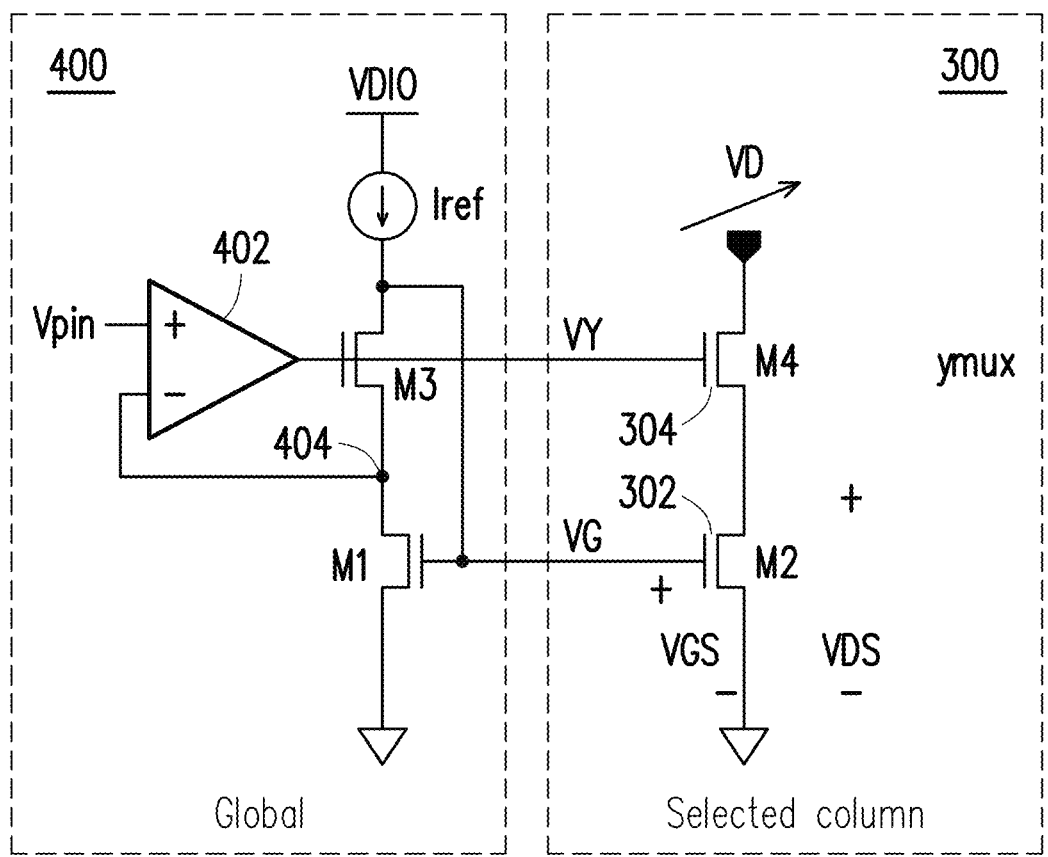
FIG. 3 is a circuit diagram illustrating another example bias generator circuit coupled to another example current limiter circuit in accordance with some embodiments.

FIG. 3 is a circuit diagram illustrating an example bias generator circuit 400 coupled to an example current limiter circuit 300 as illustrated in FIG. 2, in accordance with some embodiments. In the example illustrated, the bias generator circuit 400 includes a voltage source VDIO providing a reference current Iref to the circuit, a transistor M3, and transistor M1, an Op Amp 402 and a node 404 at the drain-source junction of transistors M3 and M1, all connected as described above in relation to FIG. 2. The current limiter circuit 300 includes a cascade, or stacked, arrangement including a top transistor M4 and a bottom transistor M2, connected as described above in relation to FIG. 2.

In the example shown, the Op Amp 402 provides closed loop negative feedback within the bias generator circuit 400 to clamp the voltage at the node 404 to a predetermined voltage, Vpin, and thereby clamping the drain-source voltage (VDS) of the transistor M1 to the voltage Vpin as well. In the example shown, the voltage at the node 404 is equal to the gate voltage of the transistor M3, e.g. the output voltage VY of the Op Amp 402, minus the threshold voltage of the transistor M3. In some embodiments, Vpin is less than 1 volt (V), in other embodiments Vpin is less than 600 millivolts (mV), in other embodiments Vpin is 200 mV or less, and in still other embodiments Vpin is 100 mV or less. In some embodiments, the transistor M1 and bottom transistor M2 are matched forming a current mirror. In other words, the properties of the transistor M1 and the bottom transistor M2, such as channel length, width, threshold voltage, etc., are matched, and the gate voltage of both the transistor M1 and the bottom transistor M2 are well-defined by the closed loop connection between the gates of both the transistor M1 and the bottom transistor M2 to the source of the transistor M3 resulting in a drain-source voltage VDS of the transistor M2 that is the same as the VDS of the transistor M1, causing the current flowing through the bottom transistor M2 to mirror the current flowing through the transistor M1. In some embodiments, the Vpin is chosen to provide a voltage bias, VG, to the gate of the bottom transistor M3 in order to operate the bottom transistor M2 in the saturation region of its characteristic MOSFET I-V curve. As such, the bottom transistor M2 acts as a variable resistor and limits the current allowed to flow along the source line SL during a SET operation.

In the example shown, the output (VY) of the Op Amp 402, e.g. the gain, is chosen to apply a gate voltage to the transistor M3 that results in a reference current Iref that is equal to the desired predetermined SET current. In general, the SET current is determined by the type of resistive memory element 212 that is used in RRAM cells 210. In some embodiments, the SET current is greater than or equal to 100 micro Amperes (uA). In some embodiments, the SET current is greater than or equal to 300 uA. In still other embodiments, the SET current is greater than or equal to 450 uA.

In some embodiments, the output VY of the Op Amp 402 can vary via the negative feedback loop including the Op Amp 402 to clamp the voltage at the node 404 to Vpin, and therefore clamp the VDS of both the transistor M1 and the "mirrored" bottom transistor M2 equal to Vpin. Such variation in Op Amp 402 output VY can occur in response to changing transistor characteristics due the temperature fluctuations, for example.

In some embodiments, the operation voltage for the current limiter circuit 300 is defined by the clamping voltage Vpin plus the VDS of the top transistor M4. In some examples, 0.3V of the operation voltage can be achieved. The VDS and gate-source voltage (VGS) of the bottom transistor M2 can be fixed by the closed loop arrangement. The predetermined VDS level allows lower operation voltage. For example, in arrangements without the closed-loop negative feedback provided by the Op Amp 402, the operation voltage of the current limiter circuit 300 is typically 0.6V or greater because the gates of the transistor M3 and the top transistor M4 are typically connected to Vdd rather than the output voltage VY of the Op Amp 402. In other words, the Op Amp 402 both enables lowering the VDS of the transistor M1 in the bias generator circuit 400, and consequently the VDS of the bottom transistor M2 in the current limiter circuit 300, while providing enough voltage at the gates of the transistor M3 and the top transistor M4 to allow Iref to flow at the predetermined SET current. In addition, the closed-loop negative feedback provided by the Op Amp 402 can adaptively adjust the gate voltage of the transistor M1 to compensate for process and temperature variations, which in turn adaptively adjusts the gate voltage VG of the bottom transistor M2 by virtue of the bottom transistor M2 being a current mirror of the transistor M1, stabilizing the voltage overhead of the current limiter circuit 300.

In some embodiments, the bias generator circuit 400 is global to the memory device 100. For example, for a memory device 100, a single bias generator circuit 400 can be used to generate the VG and VY bias voltages for all of the columns of the array of resistive memory cells 200. In addition, because the top transistor M4 of the cascode current limiter circuit 300 is provided by the column MUX associated with the array of resistive memory cells 200, the main area overhead added to the memory device 100 is the single bottom transistor M2 limiter device only. In some embodiments, a plurality of bottom transistors M2 can be provided, one for each column of the array of resistive memory cells 200, rather than a single bottom transistor M2 connected to each of the column select transistors of the MUX, e.g. top transistors M4, as shown in FIG. 2.

Figure 4:
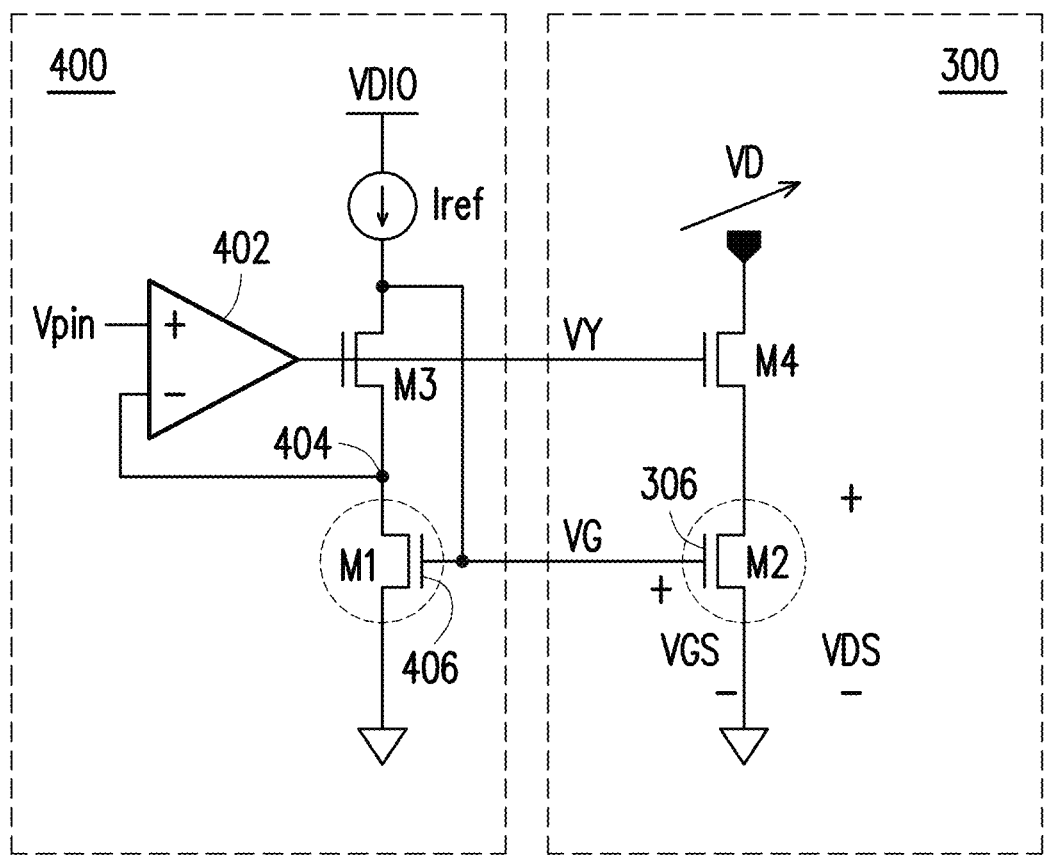
FIG. 4 is a circuit diagram illustrating another example bias generator circuit coupled to another example current limiter circuit in accordance with some embodiments.

FIG. 4 is a circuit diagram illustrating another example bias generator circuit 400 coupled to another example current limiter circuit 300 in accordance with some embodiments. Both the bias generator circuit 400 and current limiter circuit 300 illustrated in FIG. 4 are similar to their counterparts illustrated in FIG. 3, the difference being the use of an IO transistor 406 as the transistor M1 and an IO transistor 306 as the bottom transistor M2. In some embodiments, such IO transistors are relatively thicker and are more robust than the transistors used in the array of resistive memory cells 200. For example, the physical components of such IO transistors such as the N-wells, P-wells, source and drain contacts, channel width and length, polysilicon gate and gate contact, etc., are larger and rated for higher voltages and currents. In some embodiments, the use of IO transistors can protect the current limiter circuit 300, the bottom transistor M2 and the transistor M1 by virtue of such larger physical components that are able to withstand larger voltages and currents. In some embodiments, the use of IO transistors can prevent gate leakage resulting from a high gate-source voltage, VGS, on both the transistor M1 and the bottom transistor M2 by virtue of those transistors having a larger gate threshold voltage.

Figure 5:
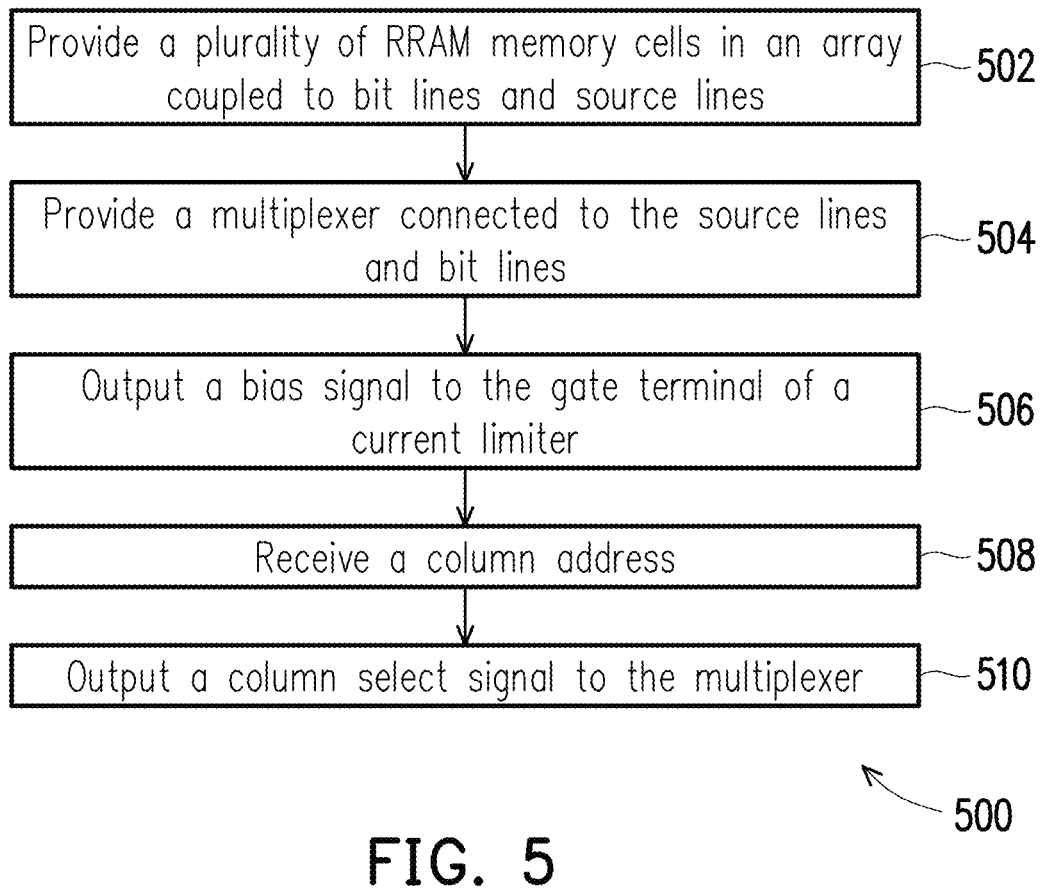
FIG. 5 is a flowchart of a method for biasing a current limiter coupled to an array of resistive memory cells in accordance with some embodiments.

FIG. 5 is a flowchart of a method for biasing a current limiter coupled to an array of resistive memory cells in accordance with some embodiments. In the example shown, a plurality of memory cells arranged in rows and columns in an array are provided at the step 502. For example, RRAM memory cells 210 in an array of resistive memory cells 200 as illustrated in FIG. 2 is provided. Also at step 502, a plurality of bit lines, source lines, and word lines are provided, and each column of the memory cells are connected between a corresponding bit line and source line, and each row of the memory cells are connected to a corresponding word line. At step 504, a multiplexer including a plurality of column select transistors, such as column select transistors M4, connected to a corresponding source line and having gates configured to receive a column select signal, e.g. having gates connected to the output voltage VY of the Op Amp 402 routed through the column decoder 450 as illustrated in FIG. 2, is provided.

In the example shown, a bias signal is output to the gate terminal of a current limiter, such as the current limiter transistor M2 that is coupled to each of the column select transistors in the MUX, at step 506. For example, a bias signal VG is output to the gate terminal of the bottom transistor M2 that is connected to the top transistor M4, e.g. the column select transistor M4. At step 508, a column address is received, for example at the column decoder 450. At step 510, a column select signal, such as ysel[m], is output to one of the column select transistors in the MUX in response to the received column address at step 508.

Accordingly, the various embodiments disclosed herein provide a current limiter with lower voltage operation overhead, for example less than 500 mV, for RRAM forming and SET operations, and reducing the voltage overhead by more than 300 mV as compared to conventional current limiters.

The various embodiments disclosed herein also provide lower area overhead used by the current limiter and the bias generator. For example, the bias generator circuit can be global, e.g. the same bias generator circuit can be used for all of the columns of the memory array, and because the column select transistor of the multiplexer of the memory array can be used as the top transistor of the current limiter cascode, the area overhead for implementing the current limiter is a single transistor, e.g. the bottom transistor, thereby reducing the area overhead as compared to convention current limiters.

The various embodiments disclosed herein further provide adaptive adjustment of the bias voltage applied to the gate of the bottom current limiting transistor in the cascode, and can therefore accommodate process and temperature variations to stabilize the voltage operation overhead.

Disclosed embodiments thus include a memory device with a memory array including a plurality of memory cells arranged in rows and columns. A closed loop bias generator is configured to output a column select signal to the memory array. A current limiter receives an output of the closed loop bias generator, and the current limiter is coupled to a plurality of the columns of the memory array.

Further disclosed embodiments include provide a memory device having a memory array including a plurality of memory cells arranged in rows and columns, a plurality of bit lines, a plurality of source lines, and a plurality of word lines. Each column of the memory cells is connected to a corresponding bit line and source line, and each row of the memory cells is connected to a corresponding word line. A multiplexer (MUX) is connected to the plurality of columns. The MUX includes a plurality of first transistors connected to corresponding source lines. The first transistors have respective gate terminals configured to receive a column select signal. A current limiter transistor is connected to each of the first transistors.

Still further embodiments include a method in which a plurality of memory cells arranged in rows and columns, a plurality of bit lines, a plurality of source lines, and a plurality of word lines are provided. Each column of the memory cells is connected to a corresponding bit line and source line, and each row of the memory cells is connected to a corresponding word line. A multiplexer (MUX) is connected to the plurality of columns, and includes a plurality of first transistors connected to corresponding source lines. The transistors have respective gate terminals configured to receive a column select signal. The method further includes outputting a predetermined bias signal to the gate terminal of a current limiter transistor that is coupled to each of the first transistors of the MUX. A column address is received, and a column select signal is generated based on the column address. The column select signal is output to one of the first transistors based on the received column address.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
 a memory array including a plurality of memory cells arranged in rows and columns;
 a closed loop bias generator configured to output a column select signal to the memory array;
 a current limiter configured to receive an output of the closed loop bias generator, the current limiter coupled to a plurality of the columns of the memory array and comprising a cascode of first and second connected NMOS transistors; and
 wherein the closed loop bias generator is further configured to clamp a drain-source voltage of the second NMOS transistor of the current limiter.

2. The memory device of claim 1, further comprising a column multiplexer (MUX) connected to the columns of the memory array, the column MUX including the first NMOS transistor in the current limiter configured to operate as a column select transistor.

3. The memory device of claim 2, wherein the column MUX includes a plurality of the column select transistors, wherein each column is connected to a corresponding one of the column select transistors, and wherein the second NMOS transistor is coupled to each of the column select transistors.

4. The memory device of claim 1, wherein the bias generator includes third and fourth cascode connected NMOS transistors, and an operational amplifier configured to receive a feedback signal and configured to generate a column select signal output to a column MUX.

5. The memory device of claim 4, wherein the bias generator further comprises:
 a voltage input terminal connected to a source of the third NMOS transistor and a gate of the fourth NMOS transistor,
 wherein a drain of the third NMOS transistor and a source of the fourth NMOS transistor are connected to an inverting input of the operational amplifier,
 wherein a non-inverting input of the operational amplifier is configured to receive a predetermined clamping voltage, and
 wherein an output of the operational amplifier is connected to a gate of the third NMOS transistor.

6. The memory device of claim 5, wherein the output of the operational amplifier is connected to a gate of the first NMOS transistor, and a source of the third NMOS transistor is connected to a gate of the second NMOS transistor.

7. The memory device of claim 4 wherein the second and fourth NMOS transistors are IO transistors.

8. The memory device of claim 5 wherein the clamping voltage is less than 500 millivolts (mV).

9. The memory device of claim 1, wherein the plurality of memory cells are resistive random access memory (RRAM) cells.

10. A memory device, comprising:
 a memory array including a plurality of memory cells arranged in rows and columns, a plurality of bit lines, a plurality of source lines, and a plurality of word lines, each column of the memory cells connected to a corresponding bit line and source line, each row of the memory cells connected to a corresponding word line;
 a multiplexer (MUX) connected to the plurality of columns, the MUX including a plurality of first transistors connected to corresponding source lines, the first transistors having respective gate terminals configured to receive a column select signal; and
 a current limiter transistor connected to each of the first transistors.

11. The memory device of claim 10, further comprising a bias generator configured to output a predetermined gate control voltage signal to a gate terminal of the current limiter transistor and the column select signal to the gate terminal of the first transistors.

12. The memory device of claim 11, wherein the bias generator includes an operational amplifier configured to receive a predetermined clamping voltage.

13. The memory device of claim 12, wherein the bias generator further comprises:
 a voltage supply terminal connected to the source of a third NMOS transistor and the gate of a fourth NMOS transistor,
 wherein the drain of the third NMOS transistor and the source of the fourth NMOS transistor are connected to the inverting input of the operational amplifier,
 wherein the non-inverting input of the operational amplifier is connected to a predetermined clamping voltage.

14. The memory device of claim 13, wherein the output of the operational amplifier is connected to the gates of the first transistors, and wherein the source of the third NMOS transistor is connected to the gate of the current limiter transistor.

15. The memory device of claim 14, wherein the current limiter transistor and the fourth NMOS transistor are TO transistors.

16. The memory device of claim 13, wherein the clamping voltage is less than 500 millivolts (mV).

17. A method, comprising:
 providing a plurality of memory cells arranged in rows and columns, a plurality of bit lines, a plurality of source lines, and a plurality of word lines, each column of the memory cells connected to a corresponding bit line and source line, each row of the memory cells connected to a corresponding word line;
 providing a multiplexer (MUX) connected to the plurality of columns, the multiplexer including a plurality of first transistors connected to corresponding source lines, the first transistors having respective gate terminals configured to receive a column select signal;
 outputting a predetermined bias signal to the gate terminal of a current limiter transistor that is coupled to each of the first transistors of the MUX;
 receiving a column address;
 generating a column select signal based on the column address;
 outputting the column select signal to one of the first transistors based on the received column address.

18. The method of claim 17, further comprising providing a bias generator configured to output the predetermined bias signal and the column select signal, wherein outputting a predetermined bias signal to the gate terminal of the current limiter includes receiving a feedback signal from a mirror transistor.

19. The method of claim 17, further comprising clamping the drain-source voltage of the current limiter transistor to a predetermined clamping voltage.

20. The memory device of claim 10, wherein the plurality of memory cells are resistive random access memory (RRAM) cells.

\* \* \* \* \*